United States Patent
Kim (10) Patent No.: US 8,338,847 B2
(45) Date of Patent: Dec. 25, 2012

(54) LIGHT EMITTING DEVICE, METHOD OF MANUFACTURING THE SAME, LIGHT EMITTING DEVICE PACKAGE AND LIGHTING SYSTEM

(75) Inventor: Sun Kyung Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 64 days.

(21) Appl. No.: 13/091,505

(22) Filed: Apr. 21, 2011

(65) Prior Publication Data

US 2011/0260187 A1    Oct. 27, 2011

(30) Foreign Application Priority Data

Apr. 23, 2010    (KR) .................. 10-2010-0037946

(51) Int. Cl.
*H01L 33/10*    (2010.01)
*H01L 21/00*    (2006.01)
*H01L 33/46*    (2010.01)

(52) U.S. Cl. ................ 257/98; 257/96; 257/E33.068; 257/E51.021; 438/29

(58) Field of Classification Search ............. 257/96, 257/E23.068, E51.021; 438/29
See application file for complete search history.

(56) References Cited

U.S. PATENT DOCUMENTS

| 7,781,791 B2 | 8/2010 | Sakai et al. ................. 257/98 |
| 7,863,599 B2 * | 1/2011 | Kim et al. ................... 257/13 |
| 7,982,207 B2 * | 7/2011 | Kim et al. ................... 257/13 |
| 2007/0036189 A1 * | 2/2007 | Hori et al. ................ 372/50.11 |
| 2008/0179605 A1 * | 7/2008 | Takase et al. ............... 257/94 |
| 2011/0266573 A1 * | 11/2011 | Kim et al. ................... 257/98 |

FOREIGN PATENT DOCUMENTS

| JP | 2008-147519 A | 6/2008 |
| KR | 10-0646636 B1 * | 11/2006 |
| KR | 10-2008-0087175 A | 9/2008 |
| KR | 10-2009-0043057 A | 5/2009 |
| KR | 10-2009-0130527 A | 12/2009 |
| WO | WO 2009/154383 A2 | 12/2009 |

* cited by examiner

*Primary Examiner* — Cheung Lee
*Assistant Examiner* — Jeremy Joy
(74) *Attorney, Agent, or Firm* — KED & Associates LLP (57) ABSTRACT

A light emitting device according to the embodiment includes a first semiconductor layer; an active layer to generate a light on the first semiconductor layer; a second conductive semiconductor layer on the active layer; a transparent electrode layer on the second conductive semiconductor layer; and a multiple thin film mirror on the transparent electrode layer, the multiple thin film mirror being formed by repeatedly stacking a first thin film layer having a first refractive index and a second thin film layer having a second refractive index different from the first refractive index by at least one time, wherein the second conductive semiconductor layer has a thickness satisfying: $2 \cdot \Phi_1 + \Phi_2 = N \cdot 2\pi \pm \Delta$, $(0 \leq \Delta \leq \pi/2)$ in which, $\Phi_1$ is a phase shift occurring when a light, which travels in a vertical direction, passes through the second conductive semiconductor layer and is expressed as $\Phi_1 = 2\pi n d/\lambda$ (n is a refractive index of the light, $\lambda$ is a wavelength of the light, and d is a thickness of the second conductive semiconductor layer), $\Phi_2$ is a phase shift occurring when the light is reflected from one of the transparent electrode layer and the multiple thin film mirror, and N is a natural number.

20 Claims, 6 Drawing Sheets

FIG.9

LIGHT EMITTING DEVICE, METHOD OF MANUFACTURING THE SAME, LIGHT EMITTING DEVICE PACKAGE AND LIGHTING SYSTEM

CROSS-REFERENCE TO RELATED APPLICATION

The present application claims priority of Korean Patent Application No. 10-2010-0037946 filed on Apr. 23, 2010, which is hereby incorporated by reference in its entirety.

BACKGROUND

The embodiment relates to a light emitting device, a method of manufacturing the same, a light emitting device package, and a lighting system.

Light emitting diodes (LEDs) are semiconductor devices that convert electric energy into light. The LED is advantageous as compared with conventional light sources, such as a fluorescent lamp or a glow lamp, in terms of power consumption, life span, response speed, safety and environmental-friendly requirement. In this regard, various studies have been performed to replace the conventional light sources with the LEDs. The LEDs are increasingly used as light sources for lighting devices such as various lamps used indoors or outdoors, liquid crystal displays, electric signboards, and street lamps.

SUMMARY

The embodiment provides a light emitting device having a novel structure, a method of manufacturing the same, a light emitting device package, and a lighting system.

The embodiment provides a light emitting device capable of improving the light emitting efficiency, a method of manufacturing the same, a light emitting device package, and a lighting system.

A light emitting device according to the embodiment includes a first semiconductor layer; an active layer to generate a light on the first semiconductor layer; a second conductive semiconductor layer on the active layer; a transparent electrode layer on the second conductive semiconductor layer; and a multiple thin film mirror on the transparent electrode layer, the multiple thin film mirror being formed by repeatedly stacking a first thin film layer having a first refractive index and a second thin film layer having a second refractive index different from the first refractive index by at least one time, wherein the second conductive semiconductor layer has a thickness satisfying: $2 \cdot \Phi 1 + \Phi 2 = N \cdot 2\pi \pm \Delta$, $(0 \leq \Delta \leq \pi/2)$, in which $\Phi 1$ is a phase shift occurring when a light, which travels in a vertical direction, passes through the second conductive semiconductor layer and is expressed as $\Phi 1 = 2\pi n d / \lambda$ (n is a refractive index of the light, $\lambda$ is a wavelength of the light, and d is a thickness of the second conductive semiconductor layer), $\Phi 2$ is a phase shift occurring when the light is reflected from one of the transparent electrode layer and the multiple thin film mirror, and N is a natural number.

A light emitting device package according to the embodiment includes a body; first and second electrode layers on the body; a light emitting device electrically connected to the first and second electrode layers on the body; and a molding member surrounding the light emitting device, wherein the light emitting device includes a first semiconductor layer; an active layer to generate a light on the first semiconductor layer; a second conductive semiconductor layer on the active layer; a transparent electrode layer on the second conductive semiconductor layer; and a multiple thin film mirror on the transparent electrode layer, the multiple thin film mirror being formed by repeatedly stacking a first thin film layer having a first refractive index and a second thin film layer having a second refractive index different from the first refractive index by at least one time, and wherein the second conductive semiconductor layer has a thickness satisfying: $2 \cdot \Phi 1 + \Phi 2 = N \cdot 2\pi \pm \Delta$, $(0 \leq \Delta \leq \pi/2)$, in which $\Phi 1$ is a phase shift occurring when a light, which travels in a vertical direction, passes through the second conductive semiconductor layer and is expressed as $\Phi 1 = 2\pi n d / \lambda$ (n is a refractive index of the light, $\lambda$ is a wavelength of the light, and d is a thickness of the second conductive semiconductor layer), $\Phi 2$ is a phase shift occurring when the light is reflected from one of the transparent electrode layer and the multiple thin film mirror, and N is a natural number.

DETAILED DESCRIPTION OF THE EMBODIMENTS

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. When an element is referred to as being 'on' or 'under', 'under the element' as well as 'on the element' can be included based on the element. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, a light emitting device, a method of manufacturing the same, a light emitting device package, and a lighting system according to the embodiments will be described in detail with reference to accompanying drawings.

Figure 1:
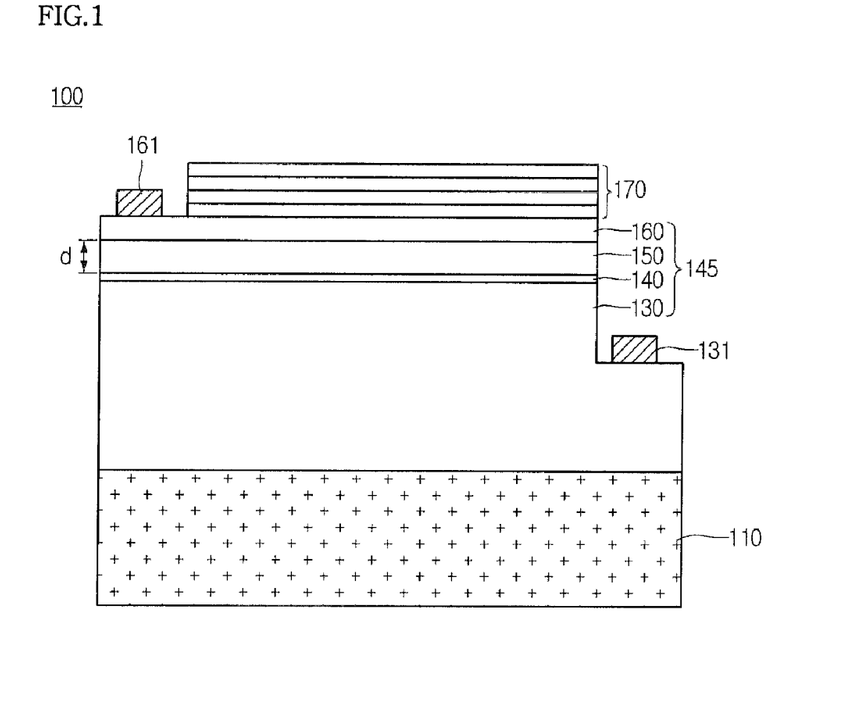
FIG. 1 is a side sectional view of a light emitting device according to the embodiment.

FIG. 1 is a side sectional view of a light emitting device 100 according to the embodiment.

Referring to FIG. 1, the light emitting device 100 according to the embodiment includes a substrate 110, a first semiconductor layer 130 on the substrate 110, an active layer 140 on the first semiconductor layer 130, a second conductive semiconductor layer 150 on the active layer 140, a transparent electrode layer 160 on the second conductive semiconductor layer 150, a multiple thin film mirror 170 on the transparent electrode layer 160, a first electrode 131 on the first semiconductor layer 130 and a second electrode 161 on the transparent electrode layer 160.

The second conductive semiconductor layer 150 has a thickness (d) satisfying $2 \cdot \Phi 1 + \Phi 2 = N \cdot 2\pi \pm \Delta$, $(0 \leq \Delta \leq \pi/2)$, wherein $\Phi 1$ is a phase shift occurring when a light, which is emitted from the active layer 140 and travels in the vertical direction, passes through the second conductive semiconductor layer 150, $\Phi 2$ is a phase shift occurring when a light, which is emitted from the active layer 140 and travels in the vertical direction, is reflected from one of the transparent electrode layer 160 and the multiple thin film mirror 170, and N is a natural number.

The thickness of the second conductive semiconductor layer 150 is set such that the constructive interference may occur between the light emitted from the active layer 140 and the light reflected from the transparent electrode layer 160. In this case, the light emitting efficiency of the light emitting device 100 can be improved.

In addition, the multiple thin film mirror 170 can be formed by stacking at least two thin film layers having refractive indexes different from each other. The multiple thin film mirror 170 reflects the incident light so that the constructive interference effect of the light can be maximized in the light emitting device 100 according to the embodiment.

Hereinafter, the elements of the light emitting device 100 according to the embodiment will be described in detail.

The substrate 110 may include a transmittive material. For instance, the substrate 110 may include at least one of $Al_2O_3$, a single crystalline substrate, SiC, GaAs, GaN, ZnO, AlN, Si, GaP, InP, and Ge, but the embodiment is not limited thereto. The substrate 110 may be a growth substrate on which a light emitting structure 145 is grown.

Preferably, the refractive index of the substrate 110 is lower than the refractive index of the first semiconductor layer 130 to improve the light extracting efficiency.

A top surface of the substrate 110 may be inclined or formed with a plurality of protrusion patterns to facilitate the growth of the light emitting structure 145 and to improve the light extraction efficiency of the light emitting device 100. For example, the protrusion patterns may have one of a hemispherical shape, a polygonal shape, a triangular pyramid shape, and a nano-column shape.

The light emitting structure 145 may be formed on the substrate 110. The light emitting structure 145 may include at least the first semiconductor layer 130, the active layer 140 and the second conductive semiconductor layer 150 to emit the light.

The first semiconductor layer 130 may exclusively include a first conductive semiconductor layer or an undoped semiconductor layer can be formed under the first conductive semiconductor layer, but the embodiment is not limited thereto. In addition, a buffer layer (not shown) can be formed between the light emitting structure 145 and the substrate 110 to attenuate the lattice mismatch.

The first conductive semiconductor layer may include an n type semiconductor layer. The n type semiconductor layer may include a semiconductor material having a compositional formula of $In_xAl_yGa_{1-x-y}N$ ($0 \leq x \leq 1$, $0 \leq y \leq 1$, $0 \leq x+y \leq 1$). For example, the first conductive semiconductor layer may include a material selected from the group consisting of GaN, AlN, AlGaN, InGaN, InN, InAlGaN, and AlInN. The first conductive semiconductor layer may be doped with n type dopant, such as Si, Ge, and Sn.

The undoped semiconductor layer is formed to improve the crystalline property of the first conductive semiconductor layer. The undoped semiconductor layer may be identical to the first conductive semiconductor layer except that the undoped semiconductor layer has electric conductivity remarkably lower than that of the first conductive semiconductor layer because the undoped semiconductor layer is not doped with the n type dopant.

The first semiconductor layer 130 can be formed by injecting trimethyl gallium (TMGa) gas, ammonia ($NH_3$) gas, and silane ($SiH_4$) gas into a chamber together with hydrogen (H2) gas. In addition, the first semiconductor layer 130 can be prepared as a single layer or a multiple layer.

The active layer 140 may be formed on the first semiconductor layer 130. The active layer 140 may generate light based on the energy gap difference occurring during the recombination of the electrons and the holes provided from the first semiconductor layer 130 and the second conductive semiconductor layer 150, respectively.

For instance, the active layer 140 may include a semiconductor material having a compositional formula of $In_xAl_yGa_{1-x-y}N$ ($0 \leq x \leq 1$, $0 \leq y \leq 1$, $0 \leq x+y \leq 1$). The active layer 140 may include one of a single quantum well structure, a multiple quantum well (MQW) structure, a quantum wire structure or a quantum dot structure. If the active layer 140 has the multiple quantum well structure, the active layer 140 can be formed by stacking a plurality of well layers and a plurality of barrier layers. For instance, the active layer 140 may have a stack structure of an InGaN well layer/a GaN barrier layer.

The active layer 140 can be formed by injecting trimethyl gallium (TMGa) gas, trimethyl indium (TMIn) gas, and ammonia ($NH_3$) gas into a chamber together with hydrogen (H2) gas.

A conductive clad layer can be formed on and/or under the active layer 140. The conductive clad layer may include an AlGaN-based semiconductor.

The second conductive semiconductor layer 150 may be formed on the active layer 140. For instance, the second conductive semiconductor layer 150 may include a p type semiconductor layer including a semiconductor material having the compositional formula of $In_xAl_yGa_{1-x-y}N$ ($0 \leq x \leq 1$, $0 \leq y \leq 1$, $0 \leq x+y \leq 1$). In detail, the p type semiconductor layer may include one selected from the group consisting of GaN, AlN, AlGaN, InGaN, InN, InAlGaN, and AlInN. In addition, the p type semiconductor layer may be doped with a p type dopant, such as Mg, Zn, Ca, Sr, or Ba.

The second conductive semiconductor layer 150 can be formed by injecting TMGa gas, $NH_3$ gas, and (EtCp$_2$Mg){Mg($C_2H_5C_5H_4$)$_2$} gas into the chamber together with the hydrogen gas.

Meanwhile, the first semiconductor layer 130 may include a p type semiconductor layer and the second conductive semiconductor layer 150 may include an n type semiconductor layer. In addition, a third conductive semiconductor layer (not shown) including the n type or the p type semiconductor layer may be formed on the second conductive semiconductor layer 150. Thus, the light emitting structure 145 may include at least one of an NP, PN, NPN, PNP junction structures. In addition, the doping concentration of impurities in the first semiconductor layer 130 and the second conductive semiconductor layer 150 may be regular or irregular. In other words, the light emitting structure 145 may have various structures, but the embodiment is not limited thereto.

The light emitting structure 145 including the first semiconductor layer 130, the active layer 140 and the second conductive semiconductor layer 150 may have various structures without being limited to the structure described in the embodiment.

The transparent electrode layer 160 may be formed on the second conductive semiconductor layer 150. The transparent electrode layer 160 uniformly spreads the current in the second conductive semiconductor layer 150.

For instance, the transparent electrode layer 160 may include at least one selected from the group consisting of ITO, IZO(In—ZnO), GZO(Ga—ZnO), AZO(Al—ZnO), AGZO (Al—Ga ZnO), IGZO(In—Ga ZnO), $IrO_x$, $RuO_x$, $RuO_x$/ITO, Ni/$IrO_x$/Au and Ni/$IrO_x$/Au/ITO.

The multiple thin film mirror 170 may be formed on the transparent electrode layer 160. The multiple thin film mirror 170 can be formed by repeatedly stacking at least two thin film layers having refractive indexes different from each other. The multiple thin film mirror 170 reflects the lights, which are incident at a predetermined incident angle through the second conductive semiconductor layer 150 and the transparent electrode layer 160, so that the constructive interference effect of the light can be maximized in the light emitting device 100 according to the embodiment.

Figure 2:
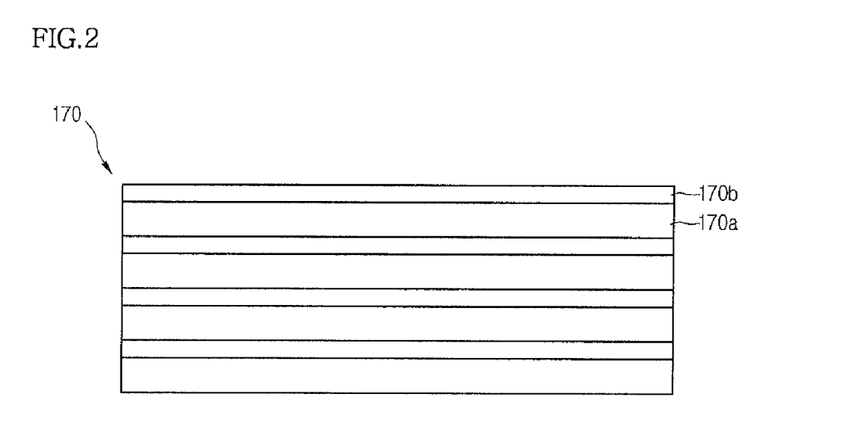
FIG. 2 is an enlarged view of a multiple thin film mirror of the light emitting device shown in FIG. 1.

FIG. 2 is an enlarged view of the multiple thin film mirror 170 of the light emitting device shown in FIG. 1.

Referring to FIG. 2, the multiple thin film mirror 170 is formed by repeatedly stacking a first thin film layer 170a having a first refractive index n1 and a second thin film layer 170b having a second refractive index n2, which is different from the first refractive index n1, by at least one time.

The first and second thin film layers 170a and 170b may have the thickness satisfying the following equation 1.

$$\text{Thickness}=(2m+1)\cdot\lambda/4n\pm\Delta, (\lambda\text{:wavelength of light}, n\text{: refractive index}, m\text{:natural number}, \Delta\leq\lambda/8n) \quad \text{Equation 1}$$

In detail, the thickness of the first thin film layer 170a is $(2m+1)\cdot\lambda/4n1\pm\Delta1$ ($\Delta1=\lambda/8n1$) and the thickness of the second thin film layer 170b is $(2m+1)\cdot\lambda/4n2\pm\Delta2$ ($\Delta2=\lambda/8n2$).

Meanwhile, if the first thin film layer 170a is positioned at the lowest layer of the multiple thin film mirror 170, the refractive index of the first thin film layer 170a is preferably higher or lower than that of the second thin film layer 170a and the transparent electrode layer 160. That is, in order to maximize the reflective effect obtained from the stack structure of a plurality of thin film layers, it is preferred to alternately stack the thin film layers having the high refractive index and the low refractive index.

For instance, the first thin film layer 170a may include $TiO_2$ having the first refractive index n1 of 2.44, the second thin film layer 170b may include $SiO_2$ having the second refractive index n2 of 1.46, and the transparent layer 160 may include ITO having the refractive index of 1.46. However, the material for the first and second thin film layers 170a and 170b may not be limited to the above. For instance, the first and second thin film layers 170a and 170b may include one of oxide-based compound, nitride-based compound, and fluoride-based compound.

In addition, the first and second thin film layers 170a and 170b may be repeatedly stacked by at least one time. If the first and second thin film layers 170a and 170b are excessively stacked, the quantity of light extracted to the outside through the multiple thin film mirror 170 may be reduced, so that the light emitting efficiency of the light emitting device may be degraded. In contrast, if the first and second thin film layers 170a and 170b are insufficiently stacked, the reflective effect of the multiple thin film mirror 170 may be degraded. Thus, the number of the first and second thin film layers 170a and 170b may vary depending on the design of the light emitting device 100 according to the embodiment.

Referring again to FIG. 1, the first electrode 131 may be formed on the first semiconductor layer 130 and the second electrode 161 may be formed on the transparent electrode layer 160.

The first electrode 131 may be formed at an upper portion of the first semiconductor layer 130 and the second electrode 161 may be formed at an upper portion of the transparent electrode layer 160 in order to supply power from an external power source to the light emitting device 100.

For instance, the first and second electrodes 131 and 161 may be prepared as a single layer or a multiple layer by using at least one of Al, Ti, Cr, Ni, Cu, and Au.

The multiple thin film mirror 170 may not overlap with the first and second electrodes 131 and 161 in the vertical direction and may overlap with the second electrode 161 in the horizontal direction. The total area of the multiple thin film mirror 170 may be smaller than an area of the active layer 140 and the multiple thin film mirror 170 may fully overlap with the active layer 140 in the vertical direction.

According to the light emitting device 100 of the embodiment, the thickness (d) of the second conductive semiconductor layer 150 may satisfy following equation 2, which is the constructive interference condition of the light.

$$2\cdot\Phi1+\Phi2=N\cdot2\pi\pm\Delta, (0\leq\Delta\leq\pi/2) \quad \text{Equation 2}$$

In above equation 2, $\Phi1$ is a phase shift occurring when the light, which travels in the vertical direction, passes through the second conductive semiconductor layer 150, $\Phi2$ is a phase shift occurring when the light is reflected from one of the transparent electrode layer 160 and the multiple thin film mirror 170, and N is a natural number.

In detail, $\Phi1$ is the phase shift occurring when the light passes through the medium, such as the second conductive semiconductor layer 150, and may vary depending on the wavelength of the light and the refractive index and the thickness of the medium. In more detail, the phase shift satisfies $\Phi1=2\pi nd/\lambda$, wherein $\lambda$ is the wavelength of the light and d is the thickness of the medium, that is, the thickness of the second conductive semiconductor layer 150.

In addition, $\Phi1$ is the phase shift occurring when the light is reflected from the transparent electrode layer 160 or the multiple thin film mirror 170.

Since the transparent electrode layer 160 includes a material having density lower than that of the second conductive semiconductor layer 150, the light reflected from the transparent electrode layer 160 may be subject to the reflection at free end, so that the phase of the light may not be changed or may approximate to 0°.

The multiple thin film mirror 170 reflects the light through the total reflection according to the incident angle of the light. Thus, if the light is reflected from the multiple thin film mirror 170, the phase of the light may not be changed or may approximate to 0°.

Therefore, ideally, the phase shift $\Phi2$ is 0. In this case, if $\Phi2\approx0$ is applied to equation 2, the constructive interference condition can be represented as equation 3.

$$2\cdot\Phi1\approx N\cdot2\pi\pm\Delta, (0\leq\Delta\leq\pi/2) \quad \text{Equation 3}$$

In addition, if $\Phi1=2\pi nd/\lambda$ is applied to equation 3, the constructive interference condition can be represented as equation 4.

$$4\pi nd/\lambda\approx N\cdot2\pi\pm\Delta, (0\leq\Delta\leq\pi/2) \quad \text{Equation 4}$$

Since "d" is the thickness of the second conductive semiconductor layer, equation 5 can be obtained by arranging equation 4 based on "d".

$$d\approx\lambda/4\pi n\cdot(N\cdot2\pi\pm\Delta), (0\leq\Delta\leq\pi/2) \quad \text{Equation 5}$$

Thus, the thickness (d) of the second conductive semiconductor layer satisfying the constructive interference condition can be expressed as above equation 5.

The thickness (d) may satisfy the constructive interference condition between the light emitted from the active layer 140 and the light reflected from the transparent electrode layer 160 or the multiple thin film mirror 170, so that the light extracting efficiency of the light emitting device 100 can be improved.

In detail, a part of the light, which is emitted from the active layer 140 and directed upward, is extracted to the outside through the transparent electrode layer 160 and the multiple thin film mirror 170, but the remaining light may be reflected from the transparent electrode layer 160 or the multiple thin film mirror 170.

In addition, the light reflected from the transparent electrode layer 160 or the multiple thin film mirror 170 is directed again toward the active layer 140 so that the light may interfere with the light emitted from the active layer 140. At this time, the lights may be subject to the constructive interference or the destructive interference mainly depending on the thickness (d) of the second conductive semiconductor layer 150.

Thus, according to the embodiment, the thickness (d) of the second conductive semiconductor layer 150 is set as described above such that the intensity of the light can be amplified through the constructive interference effect, thereby improving the light extracting efficiency of the light emitting device 100.

The lights subject to the constructive interference may be changed into the lights having the higher order mode with a large period, so that the lights may not be reflected from the multiple thin film mirror 170, but extracted to the outside through the multiple thin film mirror 170.

In order to realize the constructive interference effect, the active layer 140 preferably has a thickness equal to or smaller than $\lambda/n$ (n: refractive index of light, $\lambda$: wavelength of light). If the thickness of the active layer 140 is larger than $\lambda/n$, the light emitted from one region of the active layer 140 may be subject to the constructive interference and the light emitted from the other region of the active layer 140 may be subject to the destructive interference. In this case, the adjustment of the thickness (d) of the second conductive semiconductor layer 150 may be useless.

In addition, the thickness (d) of the second conductive semiconductor layer 150 may be determined by taking the constructive interference of the light into consideration. Since the second conductive semiconductor layer 150 has the thin thickness of several hundred nm, the light having the components in the vertical direction may prevail against other lights and the quantum interference may occur.

In addition, the thickness (d) relates to the factor $\Delta$. If the factor $\Delta$ is in the range of $0 \leq \Delta \leq \pi/2$, the constructive interference may prevail against the destructive interference.

Hereinafter, the method of manufacturing the light emitting device 100 according to the embodiment will be described in detail. In the following description, the elements and structures that have been described above will be omitted or briefly explained in order to avoid redundancy.

FIGS. 3 to 6 are sectional views showing the method of manufacturing the light emitting device 100 according to the embodiment.

Figure 3:
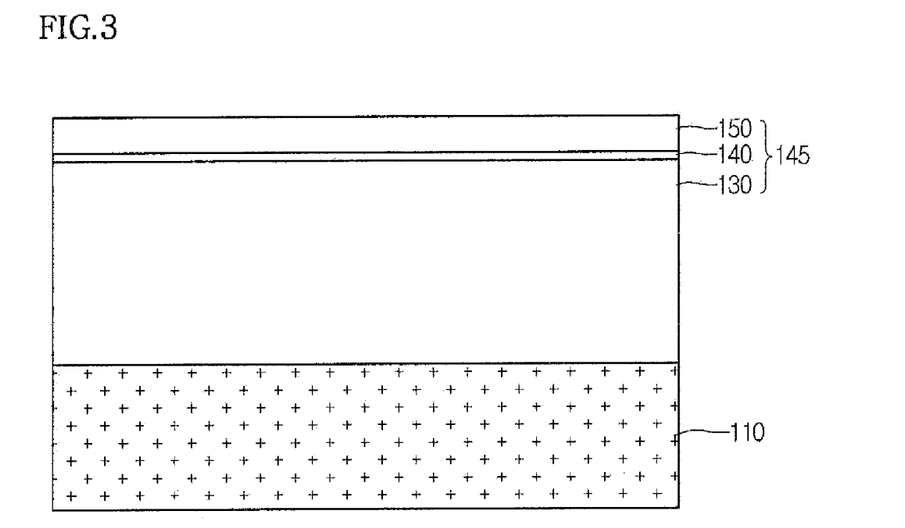
FIGS. 3 to 6 are sectional views showing the procedure for manufacturing a light emitting device according to the embodiment.

Referring to FIG. 3, the light emitting structure 145 is formed on the substrate 110 by sequentially growing the first semiconductor layer 130, the active layer 140 and the second conductive semiconductor layer 150 on the substrate 110.

The substrate 110 may include a transmittive material. For instance, the substrate 110 may include at least one of $Al_2O_3$, SiC, GaAs, GaN, ZnO, AlN, Si, GaP, InP, and Ge, but the embodiment is not limited thereto.

For instance, the light emitting structure 145 can be formed through MOCVD (Metal Organic Chemical Vapor Deposition), CVD (Chemical Vapor Deposition), PECVD (Plasma-Enhanced Chemical Vapor Deposition), MBE (Molecular Beam Epitaxy) and HVPE (Hydride Vapor Phase Epitaxy), but the embodiment is not limited thereto.

Figure 4:
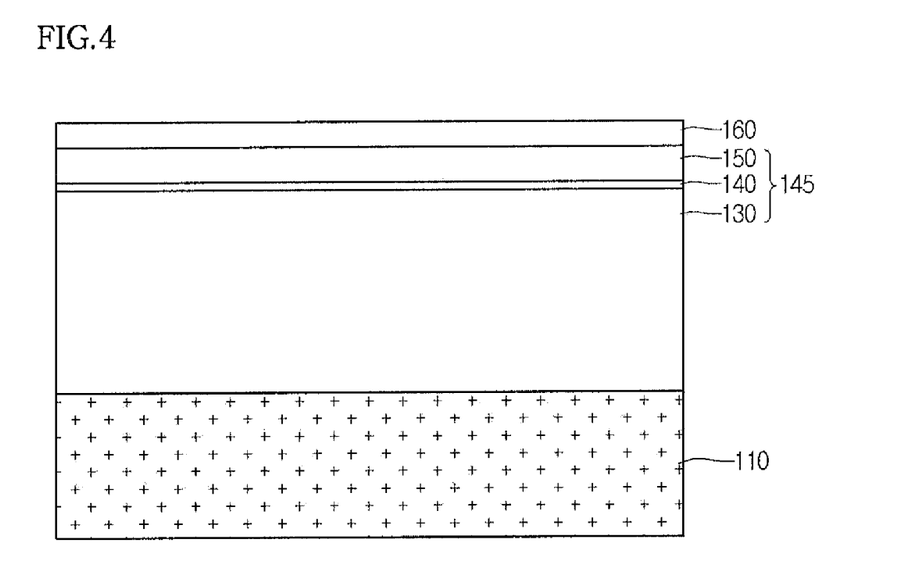
Figure 5:
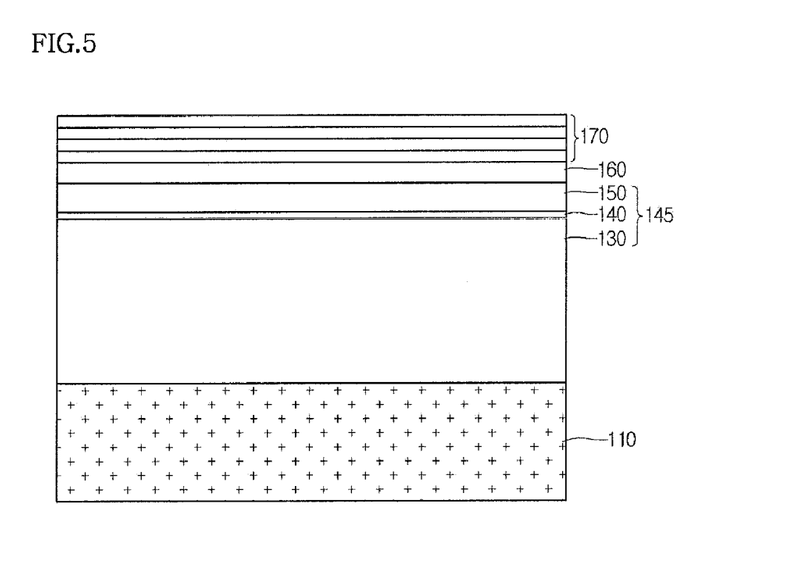

Referring to FIGS. 4 and 5, the transparent electrode layer 160 is formed on the second conductive semiconductor layer 150, and the multiple thin film mirror 170 is formed on the transparent electrode layer 160.

The transparent electrode layer 160 and the multiple thin film mirror 170 can be formed through a deposition process, such as sputtering, E-beam evaporation, and PECVD (Plasma Enhanced Chemical Vapor Deposition), but the embodiment is not limited thereto.

Figure 6:
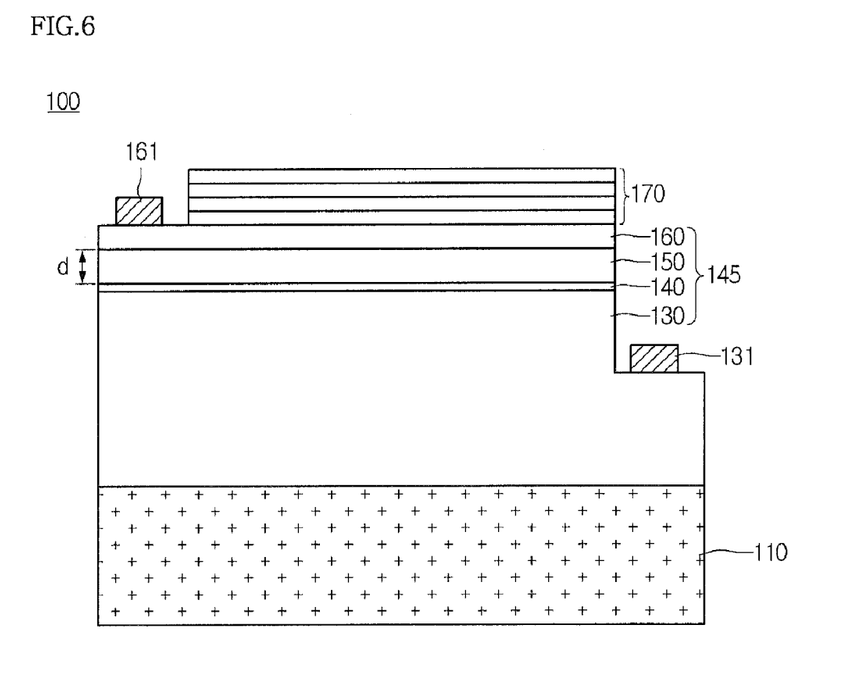

Referring to FIG. 6, the first electrode 131 is formed on the first semiconductor layer 130 and the second electrode 161 is formed on the transparent electrode layer 160, thereby providing the light emitting device 100 according to the embodiment.

The first electrode 131 can be formed on the first semiconductor layer 130 after the light emitting structure 145 has been etched such that a part of the top surface of the first semiconductor layer 130 can be exposed.

The second electrode 161 can be formed on the transparent electrode layer 160, which is exposed by selectively removing the multiple thin film mirror 170. Otherwise, the multiple thin film mirror 170 may not be formed on the region where the second electrode 161 will be formed later.

The first and second electrodes 131 and 161 can be formed through the deposition process or the plating process, but the embodiment is not limited thereto.

As described above, according to the light emitting device of the embodiment, the multiple thin film mirror 170 is disposed on the transparent electrode layer 160 and the thickness of the second conductive semiconductor layer 150 is adjusted, so that the light emitting efficiency of the light emitting device can be improved.

Figure 7:
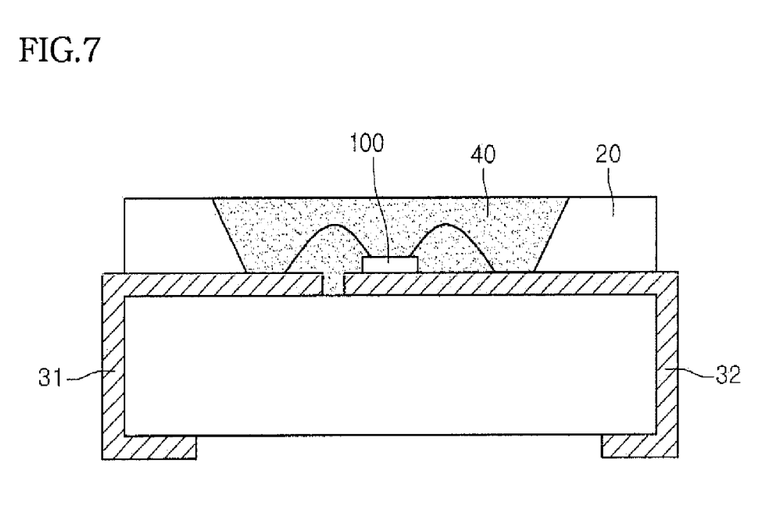
FIG. 7 is a sectional view showing a light emitting device package including a light emitting device according to the embodiment.

FIG. 7 is a side sectional view showing a light emitting device package including the light emitting device 100 according to the embodiment.

Referring to FIG. 7, the light emitting device package includes a body 10, first and second electrode layers 31 and 32 formed on the body 10, the light emitting device 100 according to the embodiment, which is provided on the body 10 and electrically connected to the first and second electrode layers 31 and 32 and a molding member 40 that surrounds the light emitting device 100.

The body 10 may include a silicon material, a synthetic resin material or a metallic material. An inclined surface may be formed around the light emitting device 100.

The first and second electrode layers 31 and 32 are electrically isolated from each other to supply power to the light emitting device 100. In addition, the first and second electrode layers 31 and 32 reflect the light emitted from the light emitting device 100 to improve the light efficiency and dissipate heat generated from the light emitting device 100 to the outside.

The light emitting device 100 can be installed on the body 10 or the first or second electrode layer 31 or 32.

The light emitting device 100 can be electrically connected to the first and second electrode layers 31 and 32 through a die bonding scheme or a flip chip scheme.

The molding member 40 surrounds the light emitting device 100 to protect the light emitting device 100. In addition, the molding member 40 may include luminescence materials to change the wavelength of the light emitted from the light emitting device 100.

At least one lens (not shown) may be formed on the molding member 40 or the body 10. The lens may include a convex lens, a concave lens or a concavo-convex lens.

A plurality of light emitting device packages according to the embodiment may be arrayed on a substrate, and an optical member including a light guide plate, a prism sheet, a diffusion sheet or a fluorescent sheet may be provided on the optical path of the light emitted from the light emitting device package. The light emitting device package, the substrate, and the optical member may serve as a backlight unit or a lighting unit. For instance, the lighting system may include a backlight unit, a lighting unit, an indicator, a lamp or a streetlamp.

Figure 8:
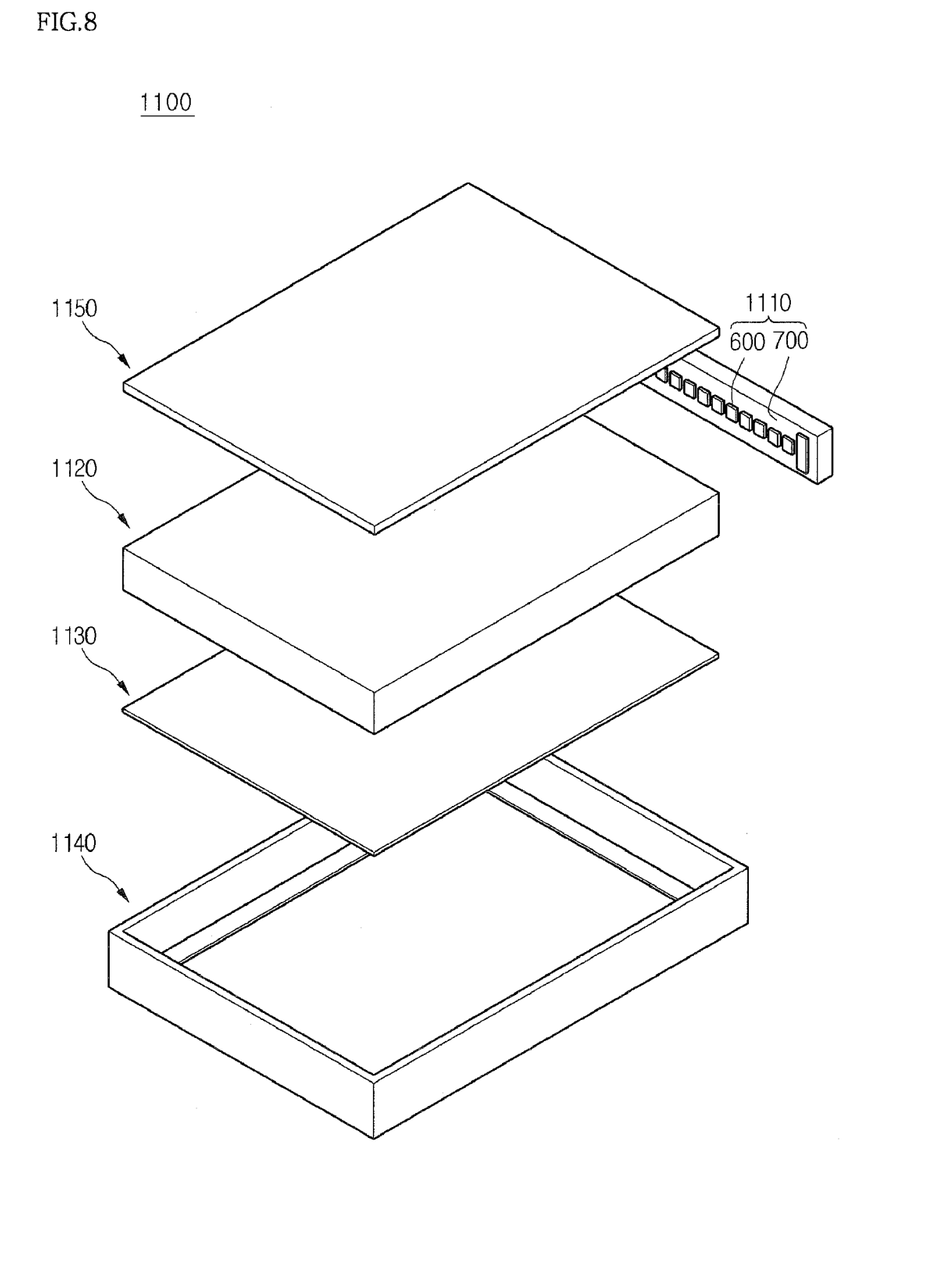
FIG. 8 is an exploded perspective view showing a backlight unit employing a light emitting device or a light emitting device package according to the embodiment.

FIG. 8 is an exploded perspective view showing a backlight unit 1100 including the light emitting device or the light emitting device package according to the embodiment. The backlight unit 1100 shown in FIG. 8 is an example of a lighting system and the embodiment is not limited thereto.

Referring to FIG. 8, the backlight unit 1100 includes a bottom frame 1140, a light guide member 1120 installed in the bottom frame 1140, and a light emitting module 1110 installed on at least one lateral side or a bottom surface of the light guide member 1120. In addition, a reflective sheet 1130 can be disposed under the light guide member 1120.

The bottom frame 1140 has a box shape having an open top surface to receive the light guide member 1120, the light emitting module 1110 and the reflective sheet 1130 therein. In addition, the bottom frame 1140 may include a metallic material or a resin material, but the embodiment is not limited thereto.

The light emitting module 1110 may include a substrate 700 and a plurality of light emitting device packages 600 installed on the substrate 700. The light emitting device packages 600 provide the light to the light guide member 1120. According to the light emitting module 1110 of the embodiment, the light emitting device packages 600 are installed on the substrate 700. However, it is also possible to direct install the light emitting device 100 according to the embodiment on the substrate 700.

As shown in FIG. 8, the light emitting module 1110 is installed on at least one inner side of the bottom frame 1140 to provide the light to at least one side of the light guide member 1120.

In addition, the light emitting module 1110 can be provided below the bottom frame 1140 to provide the light toward the bottom surface of the light guide member 1120. Such an arrangement can be variously changed according to the design of the backlight unit 1100 and the embodiment is not limited thereto.

The light guide member 1120 is installed in the bottom frame 1140. The light guide member 1120 converts the light emitted from the light emitting module 1110 into the surface light to guide the surface light toward a display panel (not shown).

The light guide member 1120 may include a light guide plate. For instance, the light guide plate can be manufactured by using one of acryl-based resin, such as PMMA (polymethyl methacrylate), PET (polyethylene terephthalate), PC (polycarbonate), COC and PEN (polyethylene naphthalate) resin.

An optical sheet 1150 may be provided over the light guide member 1120.

The optical sheet 1150 may include at least one of a diffusion sheet, a light collection sheet, a brightness enhancement sheet, and a fluorescent sheet. For instance, the optical sheet 1150 has a stack structure of the diffusion sheet, the light collection sheet, the brightness enhancement sheet, and the fluorescent sheet. In this case, the diffusion sheet uniformly diffuses the light emitted from the light emitting module 1110 such that the diffused light can be collected on the display panel (not shown) by the light collection sheet. The light output from the light collection sheet is randomly polarized and the brightness enhancement sheet increases the degree of polarization of the light output from the light collection sheet. The light collection sheet may include a horizontal and/or vertical prism sheet. In addition, the brightness enhancement sheet may include a dual brightness enhancement film and the fluorescent sheet may include a transmittive plate or a transmittive film including luminescence materials.

The reflective sheet 1130 can be disposed below the light guide member 1120. The reflective sheet 1130 reflects the light, which is emitted through the bottom surface of the light guide member 1120, toward the light exit surface of the light guide member 1120.

The reflective sheet 1130 may include resin material having high reflectivity, such as PET, PC or PVC resin, but the embodiment is not limited thereto.

Figure 9:
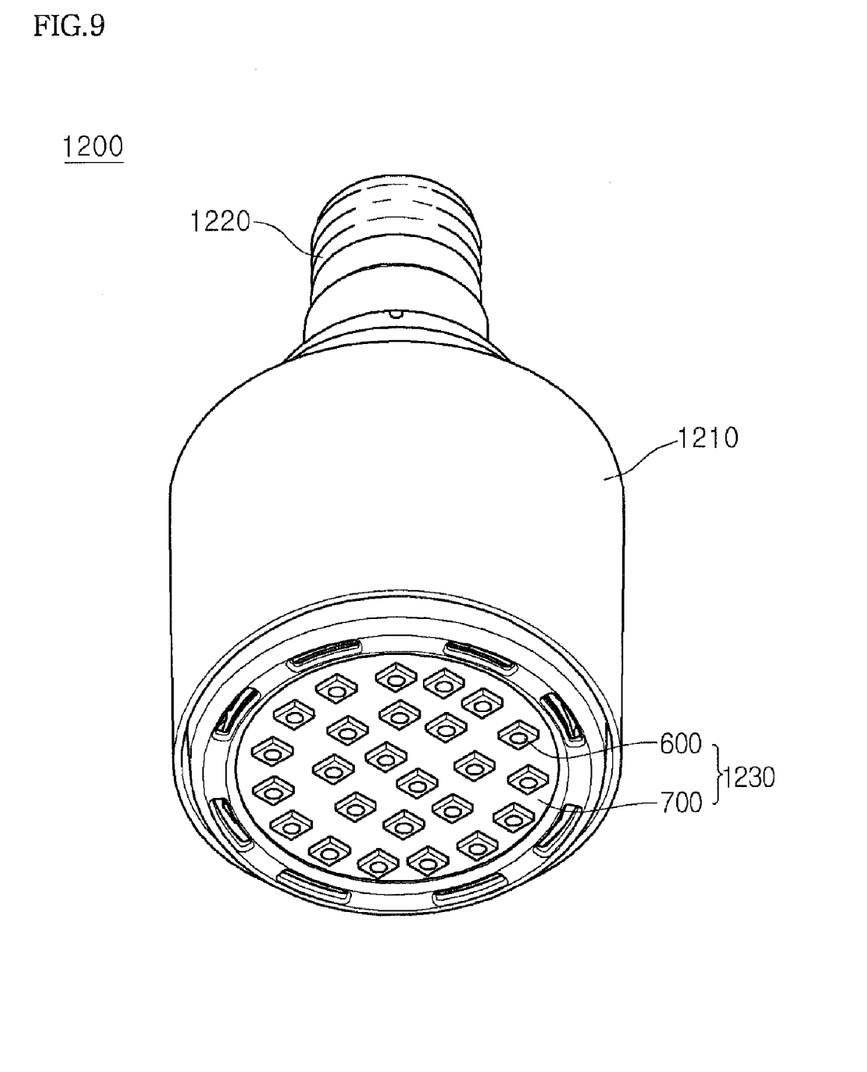
FIG. 9 is a perspective view showing a lighting unit employing a light emitting device or a light emitting device package according to the embodiment.

FIG. 9 is a perspective view showing a lighting unit 1200 including the light emitting device or the light emitting device package according to the embodiment. The lighting unit 1200 shown in FIG. 9 is an example of a lighting system and the embodiment is not limited thereto.

Referring to FIG. 9, the lighting unit 1200 includes a case body 1210, a light emitting module 1230 installed in the case body 1210, and a connection terminal 1220 installed in the case body 1210 to receive power from an external power source.

Preferably, the case body 1210 includes a material having superior heat dissipation property. For instance, the case body 1210 includes a metallic material or a resin material.

The light emitting module 1230 may include a substrate 700 and at least one light emitting device package 600 installed on the substrate 700. According to the embodiment, the light emitting device package 600 is installed on the substrate 700. However, it is also possible to direct install the light emitting device 100 according to the embodiment on the substrate 700.

The substrate 700 includes an insulating member printed with a circuit pattern. For instance, the substrate 700 includes a PCB (printed circuit board), an MC (metal core) PCB, a flexible PCB, or a ceramic PCB.

In addition, the substrate 700 may include a material that effectively reflects the light. The surface of the substrate 700 can be coated with a color, such as a white color or a silver color, to effectively reflect the light.

At least one light emitting device package 600 according to the embodiment can be installed on the substrate 700. Each light emitting device package 600 may include at least one LED (light emitting diode). The LED may include a colored LED that emits the light having the color of red, green, blue or white and a UV (ultraviolet) LED that emits UV light.

The LEDs of the light emitting module 1230 can be variously combined to provide various colors and brightness. For instance, the white LED, the red LED and the green LED can be combined to achieve the high color rendering index (CRI). In addition, a fluorescent sheet can be provided in the path of the light emitted from the light emitting module 1230 to change the wavelength of the light emitted from the light emitting module 1230. For instance, if the light emitted from the light emitting module 1230 has a wavelength band of blue light, the fluorescent sheet may include yellow luminescence materials. In this case, the light emitted from the light emitting module 1230 passes through the fluorescent sheet so that the light is viewed as white light.

The connection terminal 1220 is electrically connected to the light emitting module 1230 to supply power to the light emitting module 1230. Referring to FIG. 9, the connection terminal 1220 has a shape of a socket screw-coupled with the external power source, but the embodiment is not limited thereto. For instance, the connection terminal 1220 can be prepared in the form of a pin inserted into the external power source or connected to the external power source through a wire.

According to the lighting system as mentioned above, at least one of the light guide member, the diffusion sheet, the light collection sheet, the brightness enhancement sheet and the fluorescent sheet is provided in the path of the light emitted from the light emitting module, so that the desired optical effect can be achieved.

As described above, the lighting system includes the light emitting device or the light emitting device package having superior light emitting efficiency, so that the lighting system can represent the superior light efficiency.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a first semiconductor layer;
an active layer to generate a light on the first semiconductor layer;
a second conductive semiconductor layer on the active layer;
a transparent electrode layer on the second conductive semiconductor layer; and
a multiple thin film mirror on the transparent electrode layer, the multiple thin film mirror being formed by repeatedly stacking a first thin film layer having a first refractive index and a second thin film layer having a second refractive index different from the first refractive index by at least one time,
wherein the second conductive semiconductor layer has a thickness satisfying following equation 1:

$$2 \cdot \Phi1 + \Phi2 = N \cdot 2\pi \pm \Delta, \quad (0 \leq \Delta \leq \pi/2) \quad \text{Equation 1}$$

wherein, $\Phi1$ is a phase shift occurring when a light, which travels in a vertical direction, passes through the second conductive semiconductor layer and is expressed as $\Phi1 = 2\pi n d/\lambda$ (n is a refractive index of the light, $\lambda$ is a wavelength of the light, and d is a thickness of the second conductive semiconductor layer), $\Phi2$ is a phase shift occurring when the light is reflected from one of the transparent electrode layer and the multiple thin film mirror, and N is a natural number.

2. The light emitting device of claim 1, wherein the phase shift $\Phi2$ occurring when the light is reflected from one of the transparent electrode layer and the multiple thin film mirror is about 0°.

3. The light emitting device of claim 1, wherein a thickness of the active layer is equal to or smaller than $\lambda/n$, in which n is the refractive index of the light and $\lambda$ is the wavelength of the light.

4. The light emitting device of claim 1, wherein the transparent electrode layer includes at least one selected from the group consisting of ITO, IZO (In—ZnO), GZO (Ga—ZnO), AZO (Al—ZnO), AGZO (Al—Ga ZnO), IGZO (In—Ga ZnO), $IrO_x$, $RuO_x$, $RuO_x$/ITO, Ni/$IrO_x$/Au and Ni/$IrO_x$/Au/ITO.

5. The light emitting device of claim 1, wherein a thickness of the first thin film layer of the multiple thin film mirror is $(2m+1) \cdot \lambda/4n1 \pm \Delta1$ and a thickness the second thin film layer of the multiple thin film mirror is $(2m+1) \cdot \lambda/4n2 \pm \Delta2$, in which $\Delta2 \leq \lambda/8n2$, n1 is the first refractive index of the first thin film layer, n2 is the second refractive index of the second thin film layer, $\lambda$ is the wavelength of the light, and m is the natural number.

6. The light emitting device of claim 1, wherein the first thin film layer is formed of $TiO_2$ and the second thin film layer is formed of $SiO_2$.

7. The light emitting device of claim 1, wherein the first and second thin film layers are formed of one of oxide-based compound, nitride-based compound, and fluoride-based compound.

8. The light emitting device of claim 1, wherein the first refractive index of the first thin film layer is higher or lower than a refractive index of the transparent electrode layer and the second refractive index of the second thin film layer.

9. The light emitting device of claim 1, wherein the first semiconductor layer is formed on the substrate.

10. The light emitting device of claim 1, wherein a first electrode is formed on the first semiconductor layer and a second electrode is formed on the transparent electrode layer.

11. The light emitting device of claim 10, wherein the multiple thin film mirror is formed not to overlap with the first and second electrodes in a vertical direction.

12. A light emitting device package comprising:
a body;
first and second electrode layers on the body;
a light emitting device electrically connected to the first and second electrode layers on the body; and
a molding member surrounding the light emitting device, wherein the light emitting device comprises:
a first semiconductor layer;
an active layer to generate a light on the first semiconductor layer;
a second conductive semiconductor layer on the active layer;
a transparent electrode layer on the second conductive semiconductor layer; and
a multiple thin film mirror on the transparent electrode layer, the multiple thin film mirror being formed by repeatedly stacking a first thin film layer having a first refractive index and a second thin film layer having a second refractive index different from the first refractive index by at least one time, and wherein the second conductive semiconductor layer has a thickness satisfying following equation 1:

$$2 \cdot \Phi_1 + \Phi_2 = N \cdot 2\pi \pm \Delta, \ (0 \leq \Delta \leq \pi/2) \quad \text{Equation 2}$$

wherein, $\Phi_1$ is a phase shift occurring when a light, which travels in a vertical direction, passes through the second conductive semiconductor layer and is expressed as $\Phi_1 = 2\pi n d/\lambda$ (n is a refractive index of the light, $\lambda$ is a wavelength of the light, and d is a thickness of the second conductive semiconductor layer), $\Phi_2$ is a phase shift occurring when the light is reflected from one of the transparent electrode layer and the multiple thin film mirror, and N is a natural number.

13. The light emitting device package of claim 12, wherein the phase shift $\Phi_2$ occurring when the light is reflected from one of the transparent electrode layer and the multiple thin film mirror is about 0°.

14. The light emitting device package of claim 12, wherein a thickness of the active layer is equal to or smaller than $\lambda/n$, in which n is the refractive index of the light and $\lambda$ is the wavelength of the light.

15. The light emitting device package of claim 12, wherein the transparent electrode layer includes at least one selected from the group consisting of ITO, IZO (In—ZnO), GZO (Ga—ZnO), AZO (Al—ZnO), AGZO (Al—Ga ZnO), IGZO (In—Ga ZnO), $IrO_x$, $RuO_x$, $RuO_x$/ITO, Ni/$IrO_x$/Au and Ni/$IrO_x$/Au/ITO.

16. The light emitting device package of claim 12, wherein a thickness of the first thin film layer of the multiple thin film mirror is $(2m+1)\cdot\lambda/4n_1 \pm \Delta_1$ and a thickness the second thin film layer of the multiple thin film mirror is $(2m+1)\cdot\lambda/4n_2 \pm \Delta_2$, in which $\Delta_2 \leq \lambda/8n_2$, $n_1$ is the first refractive index of the first thin film layer, $n_2$ is the second refractive index of the second thin film layer, $\lambda$ is the wavelength of the light, and m is the natural number.

17. The light emitting device package of claim 12, wherein the first thin film layer is formed of $TiO_2$ and the second thin film layer is formed of $SiO_2$.

18. The light emitting device package of claim 12, wherein the first and second thin film layers are formed of one of oxide-based compound, nitride-based compound, and fluoride-based compound.

19. The light emitting device package of claim 12, wherein the first refractive index of the first thin film layer is higher or lower than a refractive index of the transparent electrode layer and the second refractive index of the second thin film layer.

20. The light emitting device package of claim 12, wherein a first electrode is formed on the first semiconductor layer and a second electrode is formed on the transparent electrode layer.

* * * * *